(12) United States Patent
Hayashi et al.

(10) Patent No.: US 7,081,756 B2
(45) Date of Patent: Jul. 25, 2006

(54) SUBSTRATE INSPECTION APPARATUS, SUBSTRATE INSPECTION METHOD, METHOD OF MANUFACTURING SEMICONDUCTOR DEVICE AND RECORDING MEDIUM

(75) Inventors: Hiroyuki Hayashi, Kanagawa (JP); Yuichiro Yamazaki, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/933,440

(22) Filed: Sep. 3, 2004

(65) Prior Publication Data

US 2005/0114745 A1 May 26, 2005

(30) Foreign Application Priority Data

Sep. 4, 2003 (JP) ............... 2003-312831

(51) Int. Cl.
G01R 31/08 (2006.01)
G01R 31/26 (2006.01)

(52) U.S. Cl. .................. 324/521; 324/525; 324/765

(58) Field of Classification Search ............. 324/521, 324/765, 525
See application file for complete search history.

(56) References Cited

U.S. PATENT DOCUMENTS

| | | | | |
|---|---|---|---|---|
| 4,868,506 A | * | 9/1989 | DiStefano et al. | 324/521 |
| 5,640,539 A | * | 6/1997 | Goishi et al. | 716/21 |
| 6,111,414 A | * | 8/2000 | Chatterjee et al. | 324/633 |
| 6,195,773 B1 | | 2/2001 | Wada | 714/724 |
| 6,590,409 B1 | * | 7/2003 | Hsiung et al. | 324/765 |
| 6,859,052 B1 | * | 2/2005 | Vaucher | 324/751 |
| 2001/0025929 A1 | * | 10/2001 | Nakasuji | 250/399 |

FOREIGN PATENT DOCUMENTS

JP 10-274669 10/1998

OTHER PUBLICATIONS

Yamazaki et al., "Voltage Contrast Defect Inspection of Contacts and Vias for Deep Quarter Micron Devices," Jpn. J. Appl. Phys. (Dec. 1999), 38:7168-72.

* cited by examiner

*Primary Examiner*—Vincent Q. Nguyen
*Assistant Examiner*—Amy He
(74) *Attorney, Agent, or Firm*—Finnegan, Henderson, Farabow, Garrett & Dunner, L.L.P.

(57) ABSTRACT

A substrate inspection apparatus includes a first waveform measurer which acquires a first amplitude waveform that is the amplitude waveform of an AC voltage obtained from a semiconductor of a semiconductor substrate which is being inspected when an external AC power source is connected to the semiconductor and an AC voltage from the AC power source is applied to the semiconductor, the semiconductor substrate also having an interconnection that is supposed to be connected to the semiconductor; a second waveform measurer which is connectable to the interconnection of the semiconductor substrate and acquires a second amplitude waveform that is the amplitude waveform of a voltage in the interconnection when the AC voltage is applied to the semiconductor; and an evaluator which calculates the phase difference between the first amplitude waveform and the second amplitude waveform and extracts information on a defect of the semiconductor substrate on the basis of the thus-calculated phase difference.

17 Claims, 12 Drawing Sheets

— VOLTAGE AMPLITUDE WAVEFORM PF1 : v = Vmsin$\omega$t
--- VOLTAGE AMPLITUDE WAVEFORM PF2 : v = Vmsin($\omega$t-$\Theta$)

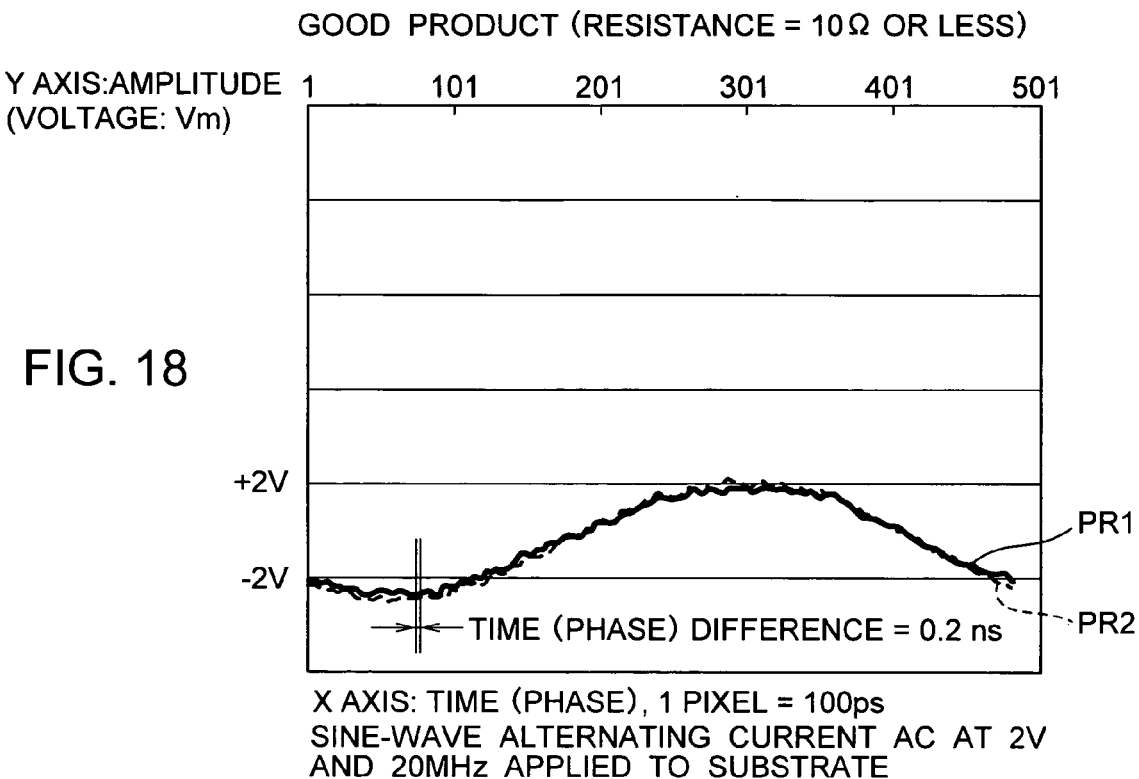
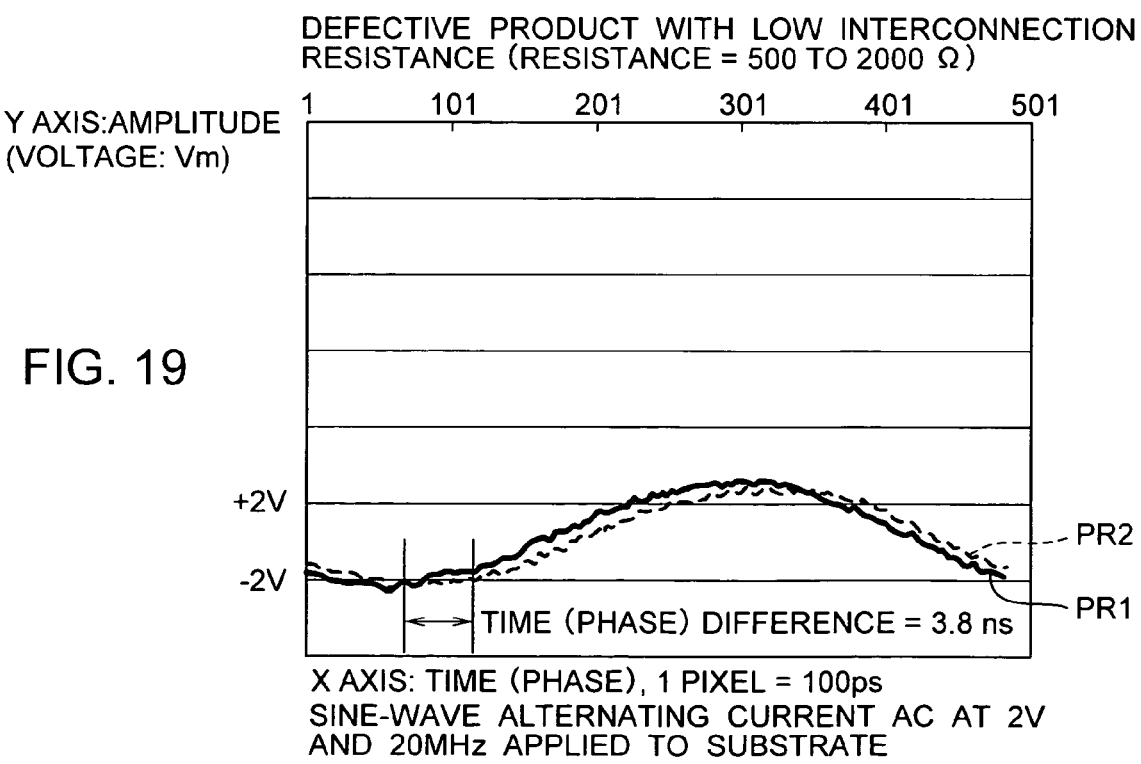

| GOOD/ DEFECTIVE PRODUCT | INTERCONNECTION RESISTANCE (Ω) | TIME (PHASE) DIFFERENCE BETWEEN WAVEFORMS PF1 AND PF2 (ns) | | | |
|---|---|---|---|---|---|
| | | AVERAGE | MEASUREMENT 1 | MEASUREMENT 2 | MEASUREMENT 3 |
| GOOD PRODUCT | 10 | 0.2 | 0.2 | 0.1 | 0.2 |
| DEFECTIVE PRODUCT | 500 | 1.1 | 1.1 | 1.1 | 1.1 |
| DEFECTIVE PRODUCT | 800 | 1.7 | 1.6 | 1.6 | 1.8 |
| DEFECTIVE PRODUCT | 1.6k | 3.2 | 3.1 | 3.4 | 3.0 |
| DEFECTIVE PRODUCT | 2.2k | 3.8 | 3.0 | 4.7 | 3.6 |

SINE-WAVE ALTERNATING CURRENT AC AT 2V AND 20MHz APPLIED TO SUBSTRATE

ABSTRACT SUBSTRATE INSPECTION APPARATUS, SUBSTRATE INSPECTION METHOD, METHOD OF MANUFACTURING SEMICONDUCTOR DEVICE AND RECORDING MEDIUM

CROSS REFERENCE TO RELATED APPLICATION

This application claims benefit of priority under 35USC §119 to Japanese Patent Application No. 2003-312831, filed on Sep. 4, 2003, the contents of which are incorporated by reference herein.

BACKGROUND OF THE INVENTION

1. Field of the Invention

The present invention relates to a substrate inspection apparatus that is used in the process of manufacturing a semiconductor device, a substrate inspection method, a method of manufacturing a semiconductor device and a recording medium. More specifically, the invention relates to inspection of defects in the electrical conductivity of contact holes or via holes in interconnection, by way of example.

2. Related Background Art

In a hole-making step during the manufacture of a semiconductor device, a defect inspection method is used in the art to detect defects in interconnections, by obtaining a potential contrast image of the surface of an interconnection that is present in one specific chip on a wafer surface, then comparing the potential contrast images of the interconnection surfaces of cells which are adjacent and which are assumed to have the same interconnection thereon or comparing further potential contrast images of the interconnection surfaces of dies which are adjacent and which are assumed to have the same interconnection thereon (as described in Jpn. J. Appl. Phys. Vol. 38 (1999) pp. 7168–7172, Voltage Contrast Defect Inspection of Contacts and Vias for Deep Quarter Micron Device, by way of example).

Such a defect inspection method is generally called a cell-to-cell image comparison inspection method or a die-to-die image comparison inspection method, and a defect inspection apparatus using electron beams is also used for these methods. The cell-to-cell image comparison inspection method is used when inspecting dies that have repetitive interconnection, such as memory devices, whereas the die-to-die image comparison inspection method is often used when inspecting dies of, such as logic devices that do not have repetitive interconnection.

In this manner, with a method of illuminating an electron beam onto the surface of the semiconductor substrate and detecting fatal defects (breaks and short-circuits) in the lower layers of the interconnection from differential images of potential contrast images of the interconnection surface, it is possible to inspect defects in a defective product having an interconnection of complete breakdown and then a high interconnection resistance (of E9 $\Omega$ upward) due to e.g. presence of an insulating film at the interface of the bottom of a hole, since there is a clear difference in signal intensity between potential contrast images to be compared, which enables determination whether or not there are defects.

With respect to a defective product which has an interconnection of low resistance (of 500 to 2,000 $\Omega$) because the interconnection is not completely broken due to e.g. tiny voids in a metallic material which fills a hole, however, a clear difference in signal intensity cannot be observed from a comparison of potential contrast images. For that reason, the inspection is difficult because it is not possible to determine defects with the use of differences in signal intensity, and thus there are problems in that not only the inspection accuracy but also the product yield drops.

SUMMARY OF THE INVENTION

According to a first aspect of the invention, there is provided a substrate inspection apparatus comprising:

a first waveform measurer which acquires a first amplitude waveform that is the amplitude waveform of an AC voltage obtained from a semiconductor of a semiconductor substrate which is being inspected when an external AC power source is connected to said semiconductor and an AC voltage from said AC power source is applied to said semiconductor, the semiconductor substrate also having an interconnection that is supposed to be connected to said semiconductor;

a second waveform measurer which is connectable to said interconnection of the semiconductor substrate and acquires a second amplitude waveform that is the amplitude waveform of a voltage in said interconnection when said AC voltage is applied to said semiconductor; and an evaluator which calculates the phase difference between said first amplitude waveform and said second amplitude waveform and extracts information on a defect of the semiconductor substrate on the basis of the thus-calculated phase difference.

According to a second aspect of the invention, there is provided a substrate inspection method comprising:

acquiring a first amplitude waveform that is the amplitude waveform of an AC voltage obtained from a semiconductor of a semiconductor substrate which is being inspected when an AC power source is connected to said semiconductor and an AC voltage from said AC power source is applied to said semiconductor, the semiconductor substrate also having an interconnection that is supposed to be connected to said semiconductor;

acquiring a second amplitude waveform that is the amplitude waveform of a voltage in said interconnection when said AC voltage is applied to said semiconductor; and calculating the phase difference between said first amplitude waveform and said second amplitude waveform and extracting information on a defect of the semiconductor substrate on the basis of the thus-calculated phase difference.

According to a third aspect of the invention, there is provided a recording medium to store a program which causes a computer to execute a method of inspecting a semiconductor substrate to be inspected that has a semiconductor and an interconnection that is supposed to be connected to said semiconductor, said computer being capable of inputting data on a first amplitude waveform and a second amplitude waveforms of AC voltages, said first amplitude waveform being obtained when an AC power source is connected to said semiconductor of the semiconductor substrate and an AC voltage from said AC power source is applied to said semiconductor, and said second amplitude waveform being obtained in said interconnection when the AC voltage from said AC power source is applied to said semiconductor, said substrate inspection method comprising:

calculating the phase difference between said first amplitude waveform and said second amplitude waveform, and extracting information on a defect of the semiconductor substrate on the basis of the thus-calculated phase difference.

According to a fourth aspect of the invention, there is provided a method of manufacturing a semiconductor device comprising:

acquiring a first amplitude waveform that is the amplitude waveform of an AC voltage obtained from a semiconductor of a semiconductor substrate which is being inspected when an AC power source is connected to said semiconductor and an AC voltage from said AC power source is applied to said semiconductor, the semiconductor substrate also having an interconnection that is supposed to be connected to said semiconductor;

acquiring a second amplitude waveform that is the amplitude waveform of a voltage in said interconnection when said AC voltage is applied to said semiconductor; and calculating the phase difference between said first amplitude waveform and said second amplitude waveform and extracting information on a defect of the semiconductor substrate on the basis of the thus-calculated phase difference.

BRIEF DESCRIPTION OF THE DRAWINGS

In the accompanying figures:

FIG. 18 is a graph of the voltage amplitude waveform obtained between the AC power source and the resistor-capacitor (R-C) element of the AC circuit of FIG. 9 and voltage amplitude waveform obtained between the R-C element and the AC power source of the AC circuit of FIG. 9, during the inspection of a good product;

FIG. 19 is a graph of the voltage amplitude waveform obtained between the AC power source and the resistor-capacitor (R-C) element of the AC circuit of FIG. 9 and voltage amplitude waveform obtained between the R-C element and the AC power source of the AC circuit of FIG. 9, during the inspection of a defective product;

DETAILED DESCRIPTION OF THE INVENTION

Embodiments of the present invention are described below.

First Embodiment

The description first concerns a first embodiment of the present invention, with reference to FIGS. 1 to 21. In this embodiment, a semiconductor substrate having a surface on which interconnection is formed, which is the object of the inspection, is placed in an electron microscope that has a strobe waveform mode and an AC voltage is applied thereto; a voltage amplitude waveform is acquired from the interconnection surface of the substrate by using the abovementioned strobe waveform mode; this is compared with the amplitude waveform of the AC voltage; and the resistance of the semiconductor substrate is calculated based on the phase difference from the amplitude waveform of the AC voltage; to determine whether this is a defective product or a good product, and also determine the degree of defect from the above-described resistance if the product is determined to be defective. This inspection concept is described below, in comparison with the prior-art inspection method.

Figure 1:
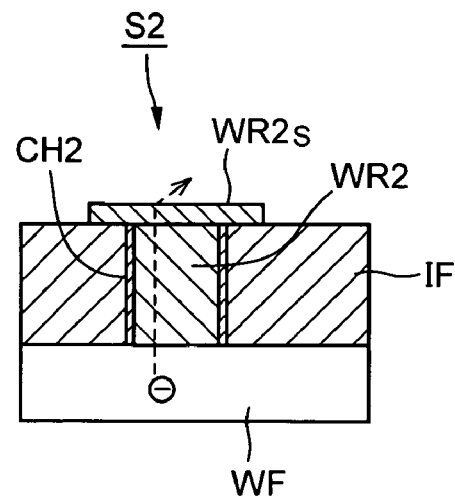
FIG. 1 is a section through an example of the semiconductor substrate of a good product.
Figure 2:
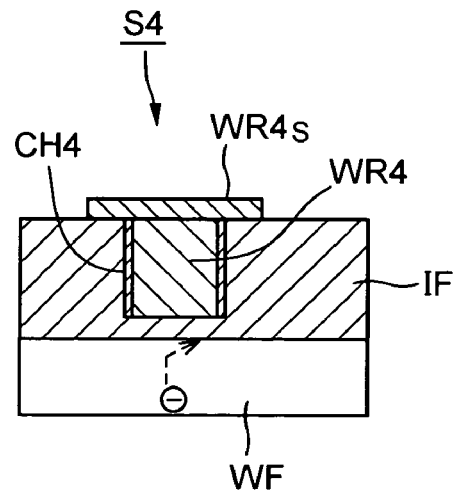
FIG. 2 is a section through an example of the semiconductor substrate of a high-resistance defective product in which interconnection has been completely broken.
Figure 3:
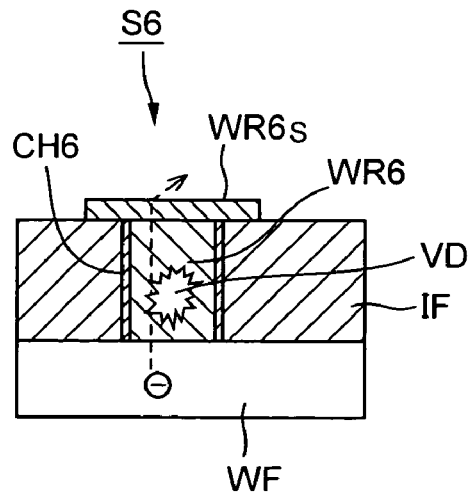
FIG. 3 is a section through an example of the semiconductor substrate of a low-resistance defective product in which the interconnection has not been completely broken.

First of all, three semiconductor substrates S2, S4 and S6 are assumed to be the objects to be inspected, as shown in FIGS. 1 to 3. The semiconductor substrate S2 shown in section in FIG. 1 is an example of a good product in which a contact hole CH2 has been formed satisfactorily within an insulating film IF that has been formed over a P-type silicon wafer WF, in such a manner as to expose the upper surface of the silicon wafer WF. Interconnection WR2 has been formed satisfactorily by filling the contact hole CH2 with a metallic material and a surface WR2s thereof also extends over the upper surface of the insulating film IF. The semiconductor substrate S4 shown in section in FIG. 2 is an example of a defective product in which the interconnection is completely broken. A contact hole CH4 has not been formed sufficiently deeply enough to reach the upper surface of the silicon wafer WF and thus metal interconnection WR4 therein is not in contact with the silicon wafer WF. Thus the resistance of the semiconductor substrate S4 is E9 Ω or greater. The semiconductor substrate S6 shown in FIG. 3 is an example of a defective product in which the interconnection is not completely broken. A contact hole CH6 has been formed satisfactorily as far as the upper surface of the silicon wafer WF, but the metallic material within the contact hole CH6 has not filled it sufficiently and thus a void VD has occurred within the contact hole CH6, forming a low-resistance interconnection WR6. For that reason, the interconnection resistance R of the semiconductor substrate S6 is low at 500 to 2,000 Ω.

Figure 4:
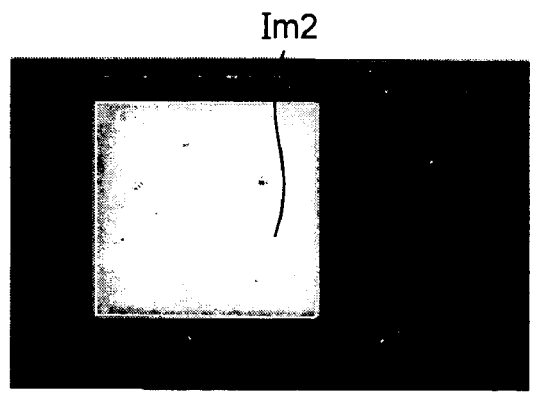
FIGS. 4 to 6 show examples of potential contrast images obtained for the semiconductor substrates shown in FIGS. 1 to 3, respectively.
Figure 5:
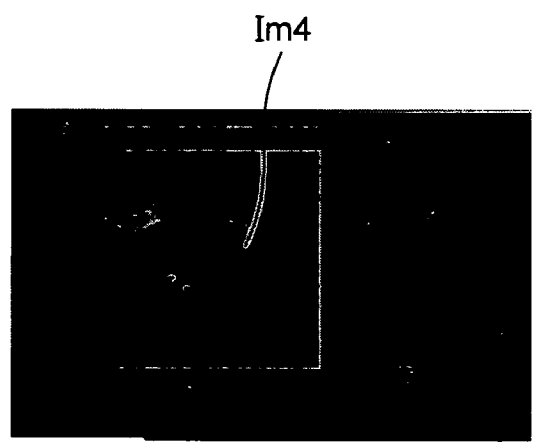

If each of these semiconductor substrates S2, S4 and S6 is set on the substrate stage of the electron microscope, a sine-wave current at 2 V and 20 MHz is applied to the P-type silicon wafer WF, and an image having contrasts that depend on the distribution of surface potential of the interconnection (hereinafter called a potential contrast image) is acquired thereof, images Im2, Im4 and Im6 are obtained such as those shown in FIGS. 4 to 6 by way of example. Observation by visual inspection of the interconnection surface of the semiconductor substrate S2 that is a good product shows repeated inversions in the light/dark areas of the interconnection surface in the corresponding potential contrast image Im2 (the still image of FIG. 4 shows an image of brightness, but actual visual inspection of the potential contrast image would confirm repeated light/dark areas inversions in the brightness of the interconnection surface). Observation by visual inspection of the interconnection surface from the potential contrast image of the semiconductor substrate S4 that is a defective product shows that the brightness is constant over the image of the interconnection surface, as shown in the image Im4 of FIG. 5. It is therefore possible to distinguish between a good product and a defective product with a high interconnection resistance by using visual inspection to confirm such differences in brightness in the potential contrast images.

Figure 6:
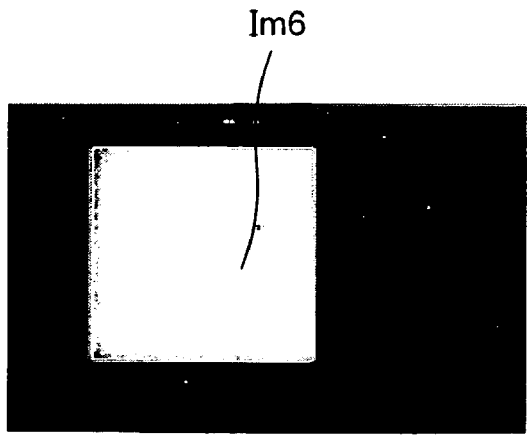

If a similar potential contrast image is acquired of the low-resistance defective product S6 in which there isn't a complete interconnection break, however, the light/dark areas inversions in the brightness of the interconnection surface will repeat in a similar manner to that of the good product, as shown in the image Im6 of FIG. 6. It is therefore difficult in the art to distinguish between a good product and a defective product with a low interconnection resistance by using potential contrast images alone.

Figure 7:
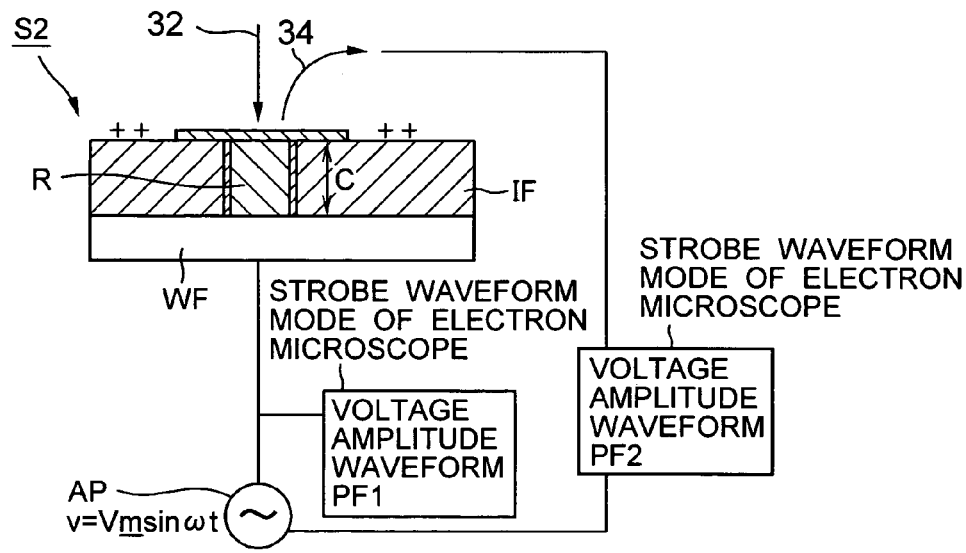
FIGS. 7 and 8 are circuit diagrams illustrating the outline of an inspection circuit used for the substrate inspection method of the present invention.
Figure 8:
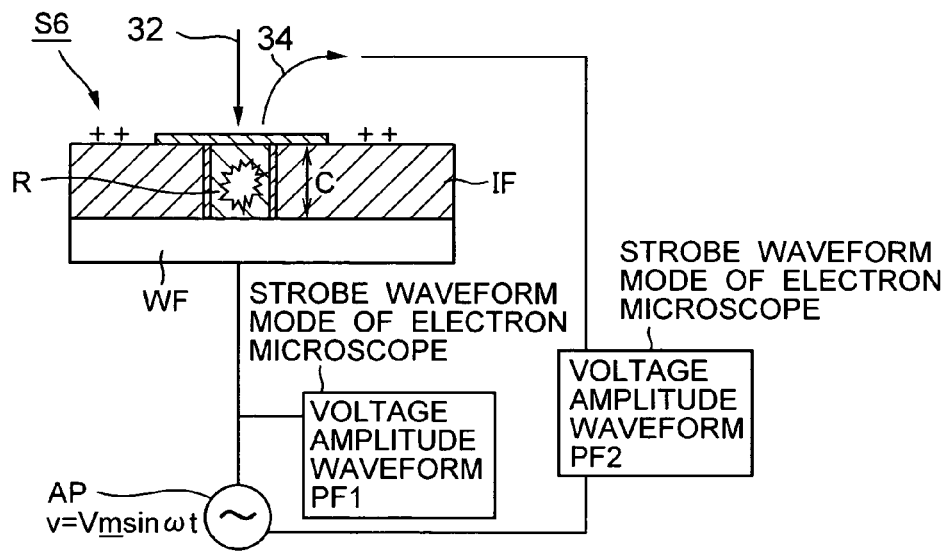

This embodiment makes it possible to distinguish reliably between a good product and a defective product with a low interconnection resistance. Circuit diagrams illustrating the outline of the inspection circuit used in this embodiment are shown in FIGS. 7 and 8. As shown in these two figures, a sine-wave current of voltage $v=Vm \sin \omega t$ (where Vm is the voltage amplitude) is applied from an AC power source AP to the rear surface of the silicon wafer WF of each of the good product S2 and the low-resistance defective product S6. A voltage amplitude waveform PF1 of the AC power source AP and a voltage amplitude waveform PF2 obtained from the interconnection surface are each acquired in the strobe waveform mode of the electron microscope while the surface of the substrate is scanned by a pulsed beam. This strobe waveform mode is a mode in which a pulsed beam is generated only at a specific phase in synchronization with the drive frequency or repeat frequency of the sample S and is illuminated onto the sample (see FIG. 15), secondary electrons SE generated from the surface of the sample S by the illumination of this pulsed beam are detected, and the voltage amplitude waveform PF2 is obtained by further processing a signal of an intensity that depends on signal denoting the thus-detected secondary electrons SE.

Figure 9:
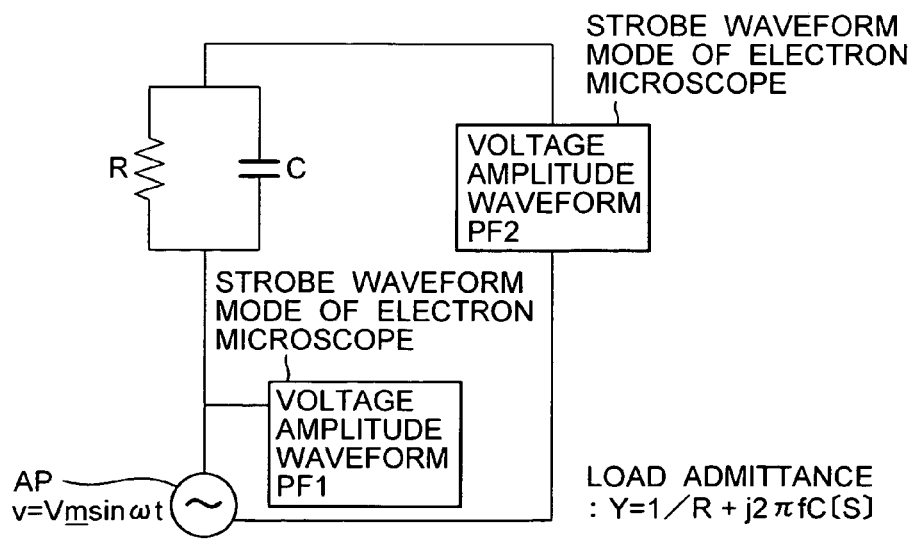
FIG. 9 is an equivalent circuit of the circuit diagrams of FIGS. 7 and 8.

If the interconnection resistance of each semiconductor substrate in this case is assumed to be R and if the insulating film can be taken to be a capacitance component (due to the action of charging the electron beam), AC circuit of FIG. 9 can be considered to be the equivalent circuit of FIGS. 7 and 8. The admittance (Y) of the load on this AC circuit is given by the theoretical equation:

$$Y=1/R+j2\pi fC\ [S]\qquad\text{(Equation 1)}$$

In this case, j is an imaginary number unit and f is the frequency of the AC power source.

Figure 10:
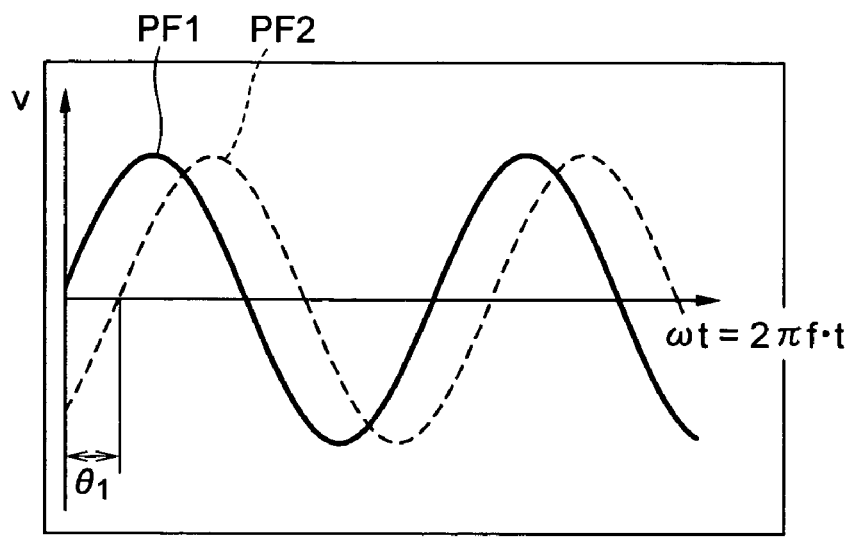
FIG. 10 is a graph of a voltage amplitude waveform obtained in the AC circuit of FIG. 9 between the AC power source and the resistor-capacitor (R-C) element and a voltage amplitude waveform obtained in the AC circuit of FIG. 9 between the R-C element and the AC power source.

Since the voltage v of the AC power source AP is given by $v=Vm \sin \omega t$, the voltage amplitude waveform PF1 is a sine wave of phase angle $\Theta=0$, as shown in FIG. 10.

Figure 11:
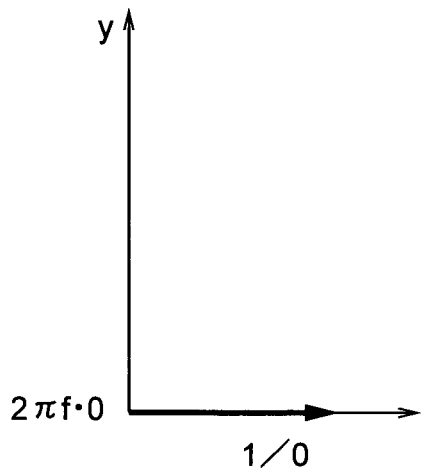
FIG. 11 is a graph of the load admittance (Y)=1/0 (Ω)+ j2πf·0 (F) [S] between the AC power source and the resistor-capacitor (R-C) element of the AC circuit of FIG. 9, plotted on a complex plane.

In addition, since the voltage amplitude waveform PF1 is the voltage amplitude waveform of the AC power source AP, the interconnection resistance R is 0 (Ω) and the capacitance C is 0 (F). Therefore, substituting 0 (Ω) for the interconnection resistance R and 0 (F) for the capacitance C into the theoretical equation for the load admittance (Y) gives a load admittance (Y) of $1/0$ (Ω)+j2πf·0 (F) [S] which, when plotted on the complex plane, give a phase angle $\Theta$ of 0, as shown in FIG. 11.

Figure 12:
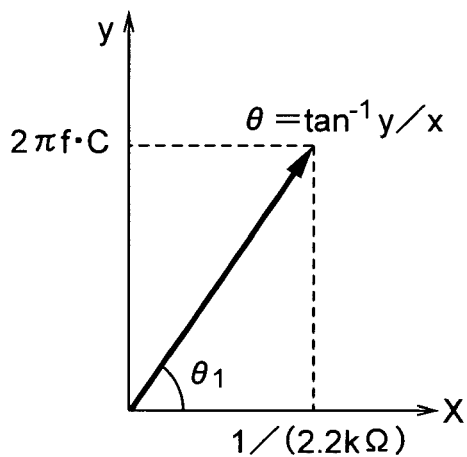
FIG. 12 is a graph of the load admittance (Y)=1/2.2 (kΩ)+j2πfC(F) [S] between the AC power source and the resistor-capacitor (R-C) element of the AC circuit of FIG. 9 during an inspection of a defective product with a high interconnection resistance, plotted on a complex plane.

Since the voltage amplitude waveform PF2 in the AC circuit of FIG. 9 is the voltage amplitude waveform that is obtained between the parallel-connected interconnection resistance (R) and capacitance (C) element and the AC power source, substituting a value such as 2.2 (kΩ) for the interconnection resistance R into the theoretical equation for load admittance (Y) in Equation 1 gives a load admittance (Y) of 1/2.2 (kΩ)+j2πfC (F) [S]. Plotting this onto the complex plane as shown in FIG. 12 gives a phase angle $\Theta$ of $\Theta 1$. The waveform of the voltage amplitude waveform PF2 is also shown in the graph of FIG. 10.

Figure 13:
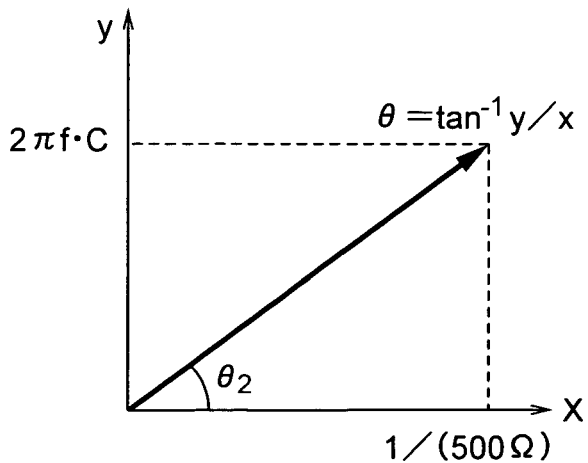
FIG. 13 is a graph of the load admittance (Y)=1/500 (Ω)+j2πfC(F) [S] between the AC power source and the resistor-capacitor (R-C) element of the AC circuit of FIG. 9 during an inspection of a defective product with a low interconnection resistance, plotted on a complex plane.

In this manner, a difference ($\Theta$) is generated between the phases (times) of the voltage amplitude waveform PF1 and the voltage amplitude waveform PF2, provided the interconnection of the semiconductor substrate has a certain amount of resistance. This phase difference $\Theta$ depends on the magnitude of the interconnection resistance, so if there is a low-resistance defective product having an interconnection resistance R of 500 (Ω), the load admittance (Y) is 1/500 (Ω)+j2πfC (F), and plotting this on the complex plane gives a phase angle $\Theta$ of $\Theta 2$ (<$\Theta 1$), as shown in FIG. 13.

If the phase difference between the voltage amplitude waveform PF1 and the voltage amplitude waveform PF2 is calculated and the thus-calculated phase difference is equal to or below a predetermined threshold, it is therefore possible to determine that the substrate being inspected is a good product. If the thus-calculated phase difference exceeds the predetermined threshold, on the other hand, the substrate being inspected can be identified as a defective product. In addition, if relationships between phase difference and resistance are prepared beforehand from measurements, the interconnection resistance of the substrate being inspected can be calculated from the phase difference, by referencing these relationships from a data table.

The description below relates to a first embodiment of a substrate inspection method in accordance with the present invention in which the above-described inspection concept is employed and a substrate inspection apparatus that is the first embodiment of the substrate inspection apparatus in accordance with the present invention and that is used in the above substrate inspection method, with reference to the accompanying figures.

Figure 14:
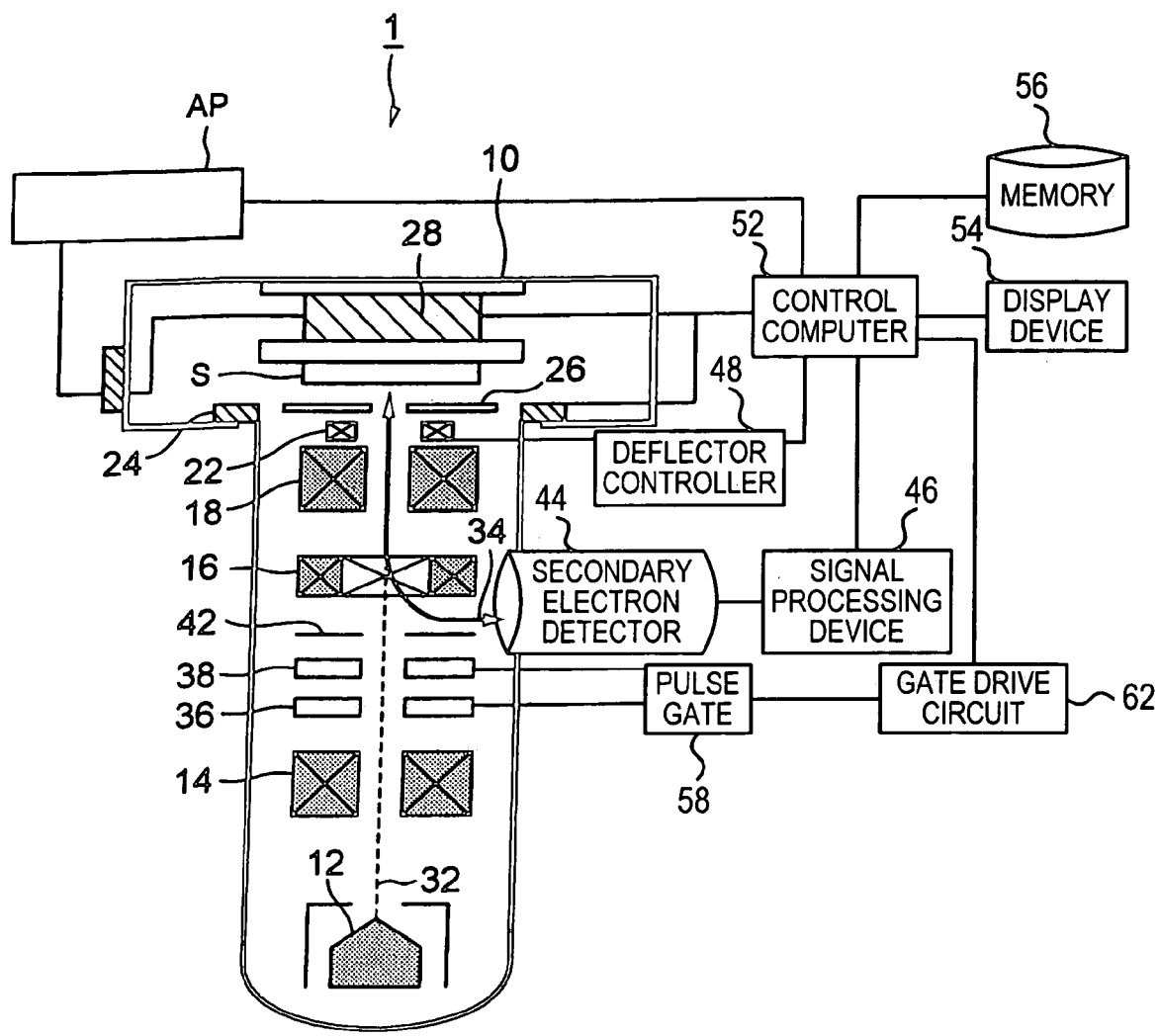
FIG. 14 is a block diagram of a first embodiment of the substrate inspection apparatus according to the present invention.
Figure 15:
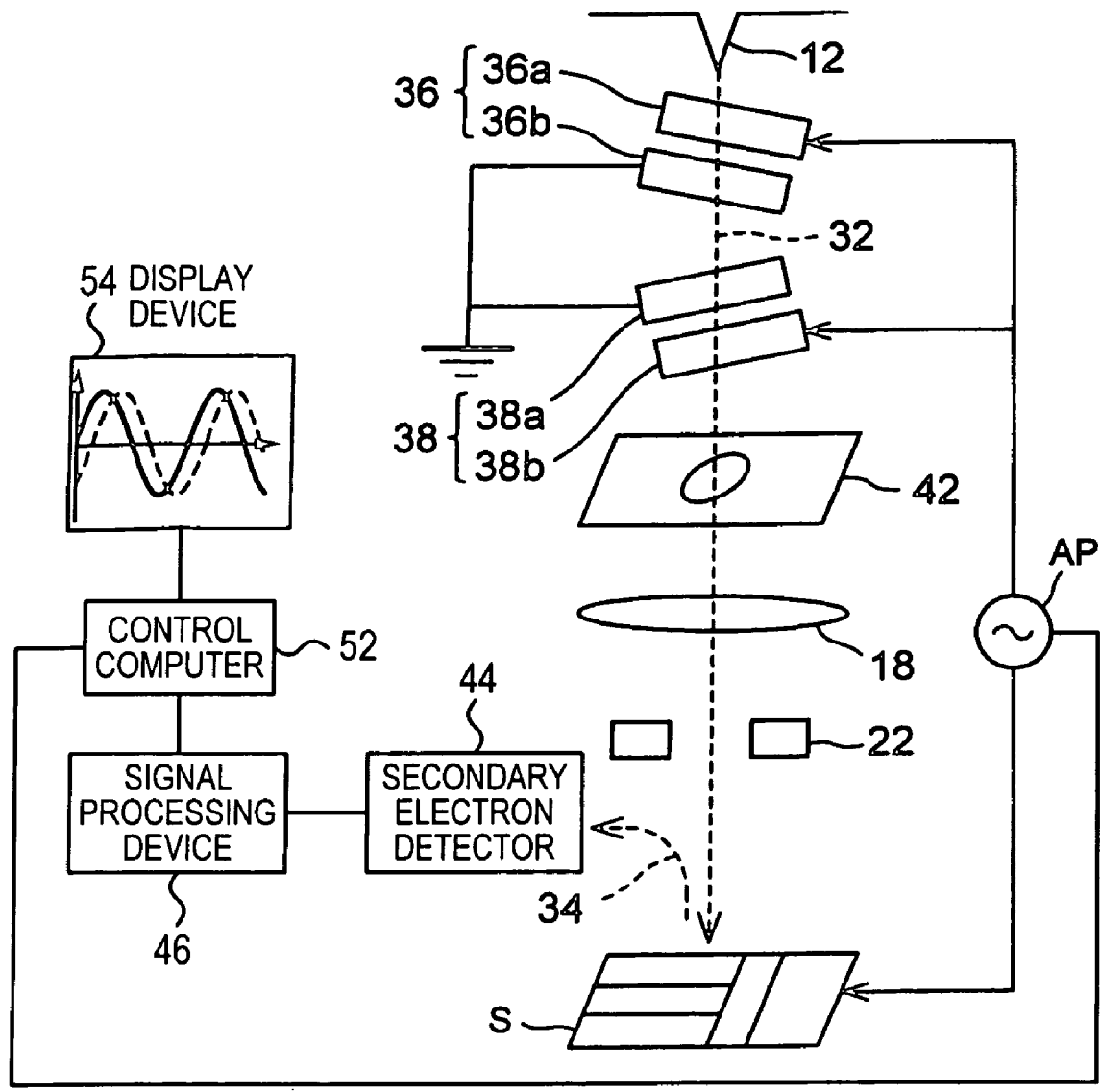
FIG. 15 is a block diagram showing the substrate inspection apparatus of FIG. 14 used in strobe waveform mode.

A block diagram of the substrate inspection apparatus in accordance with this embodiment is shown in FIG. 14. A substrate inspection apparatus 1 shown in this figure comprises an electron beam column 10, the AC power source AP, a secondary electron detector 44, a signal processing device 46, a deflector controller 48, a control computer 52, a display device (a CRT) 54, memory 56, a pulse gate 58 and a gate drive circuit 62.

The electron beam column 10 includes an electron gun 12, a condenser lens 14, pulsed beam deflectors 36 and 38, a Wien filter 16, an objective lens 18, a beam scan deflector 22, a column stage 24, an electrode 26 and a substrate stage 28. A semiconductor substrate S which is the object to be inspected and which has an interconnection formed on the surface thereof is held inverted on the substrate stage 28. The high-frequency sine-wave AC voltage is applied from the AC power source AP through the substrate stage 28 to the semiconductor substrate S.

A primary electron beam 32 emitted from the electron gun 12 is focused by the condenser lens 14 and is incident on the Wien filter 16. The Wien filter 16 allows the primary electron beam 32 to proceed without deviation and be incident on the objective lens 18. The objective lens 18 focuses the primary electron beam 32 in such a manner as to form an image at the surface of the substrate S. The thus-focused primary electron beam 32 is deflected to scan over the semiconductor substrate S by the beam scan deflector 22 that receives control signals from the deflector controller 48.

Secondary electrons, reflected electrons and back-scattered electrons (hereinafter simply called secondary electrons, etc.) are emitted from the surface of the interconnection formed on the semiconductor substrate S by the scanning of the primary electron beam 32. These secondary electrons, etc. are accelerated by an electrical field formed between the semiconductor substrate S and the objective lens 18, pass through the objective lens 18 as a secondary electron beam 34, and then are deflected by the Wien filter 16 and drawn into the secondary electron detector 44. The secondary electron detector 44 outputs a signal representing the quantity of secondary electrons, etc. detected thereby, and the signal processing device 46 converts the received signal into an image signal and supplies it to the control computer 52. The control computer 52 subjects the received image signal from the signal processing device 46 to predetermined processing and also displays a potential contrast image representing the state of the interconnection surface of the semiconductor substrate S on a display device (CRT) 54.

The memory 56 contains a program in which is written an inspection recipe for implementing the substrate inspection method in accordance with the present invention (described later, with reference to FIGS. 16 and 17), and a data table expressing the relationship between the phase difference between two voltage amplitude waveforms and interconnection resistance (see FIG. 21; hereinafter called the phase difference and interconnection resistance data table).

The control computer 52 not only controls the entire apparatus, it also fetches the inspection recipe program from the memory 56 and executes the inspection sequence based thereon.

The substrate inspection apparatus 1 shown in FIG. 14 comprises the pulse gate 58 that pulses the primary electron beam 32 and the gate drive circuit 62 that generates drive signals based on command signals from the control computer 52 and supplies them to the pulse gate 58, with the configuration being such as to enable the use of strobe waveform mode for acquiring the voltage amplitude waveform obtained from the interconnection surface. As shown in the block diagram of FIG. 15, the pulsed beam can be generated by applying a high-frequency pulse voltage to the pulsed beam deflectors 36 and 38, deflecting the primary electron beam 32 with the use of lateral electrical fields and then cutting it by an aperture 42.

The voltage amplitude waveform for the interconnection surface of the semiconductor substrate can be recorded by halting the raster scan to illuminate the beam onto one point and detecting secondary electrons, etc using the secondary electron detector 44 with the phase of the pulsed beam being slightly shifted.

The description now turns to the operation of the substrate inspection apparatus 1 of FIG. 14, with reference to FIGS. 16 to 20 as the first embodiment of the substrate inspection method in accordance with the present invention.

Figure 16:
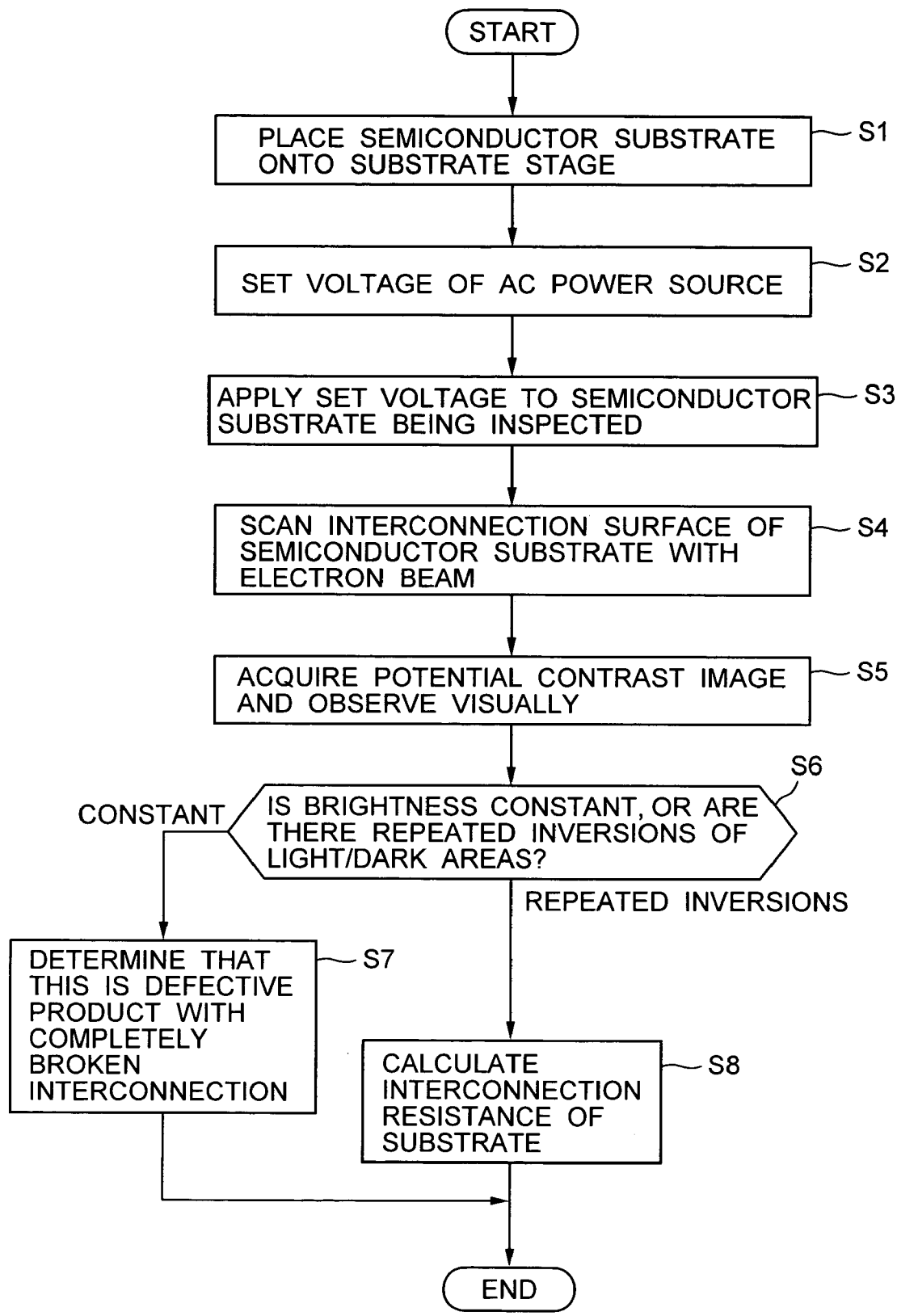
FIG. 16 is a flowchart of an outline of the sequence of the first embodiment of the substrate inspection method in accordance with the present invention.

FIG. 16 is a flowchart illustrating the basic sequence of the substrate inspection method of this embodiment. As shown in this figure, first of all, the semiconductor substrate S that is the object of inspection is placed on the substrate stage 28 of the electron beam column 10 (step S1). A sine-wave alternating current of 2 V and 20 MHz is then set as the voltage of the AC power source AP (step S2), and the sine-wave alternating current is applied to the rear surface of the semiconductor substrate S (the surface opposite to that on which the interconnection WR is formed) to apply the sine-wave AC voltage to the surface of the interconnection WR that is being inspected (step S3).

The primary electron beam 32 is then generated and is scanned over the surface of the interconnection WR of the semiconductor substrate S (step S4), and a potential contrast image of the surface of the interconnection WR is acquired and displayed on the CRT 54 for observation by visual inspection (step S5). If the brightness of the potential contrast image is constant as shown in FIG. 5 (step S6), the semiconductor substrate S is determined to be a high-resistance defective product (resistance R≧E9 Ω) (step S7) and the inspection ends. If the brightness of the semiconductor substrate S has repeated inversions of light/dark areas (step S6), on the other hand, the semiconductor substrate could either be a good product or a low resistance (500 Ω≦R≦2,000 Ω) defective product, as previously described, so the flow proceeds to step S8 in which the interconnection resistance is calculated. If the resistance is calculated to be 10 Ω or less, by way of example, the semiconductor substrate is determined to be a good product; but if the resistance is between 500 Ω and 2,000 Ω, by way of example, the determination as to whether this is a good product or a defective product will depend on the specifications required of the final product.

Figure 17:
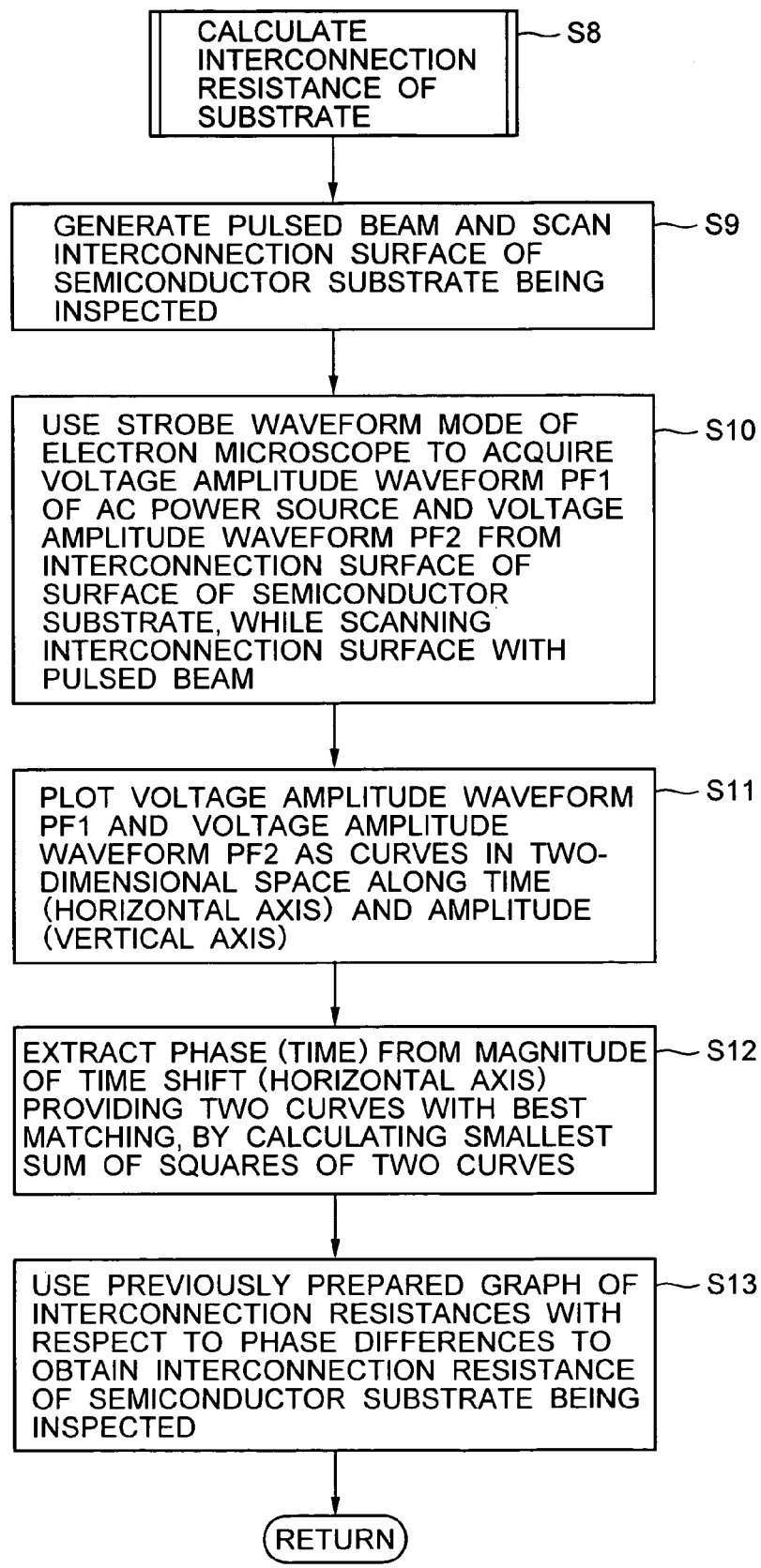
FIG. 17 is a flowchart of an example of the sequence for calculating the specific resistance of the interconnection of the semiconductor substrate.

FIG. 17 is a flowchart of an example of the sequence for calculating the interconnection resistance of the semiconductor substrate S.

First of all, strobe waveform mode is used to generate a pulsed beam that is illuminated onto the surface of the interconnection WR of the semiconductor substrate S (step S9). The sine-wave alternating current from the AC power source AP is then applied to the rear surface of the semiconductor substrate S while this pulsed beam scans the interconnection surface WRs, the voltage amplitude waveform PF1 of the AC power source and the voltage amplitude waveform PF2 acquired from the surface WRs are obtained with the strobe waveform mode of the electron microscope (step S10), and these voltage amplitude waveforms are plotted in a two-dimensional space with time along the horizontal axis and amplitude along the vertical axis (step S11).

Specific examples of these voltage amplitude waveform graphs are shown in FIGS. 18 and 19, with FIG. 18 showing the voltage amplitude waveforms PF1 and PF2 obtained for a good product in which the resistance of the interconnection WR was 10 Ω or less and FIG. 19 showing the voltage amplitude waveforms PF1 and PF2 obtained for a defective product in which the resistance of the interconnection WR was 500 Ω to 2,000 Ω. These graphs can be created easily by inputting the coordinates for each voltage amplitude waveform to generic graphing software.

Figures 20, 21:
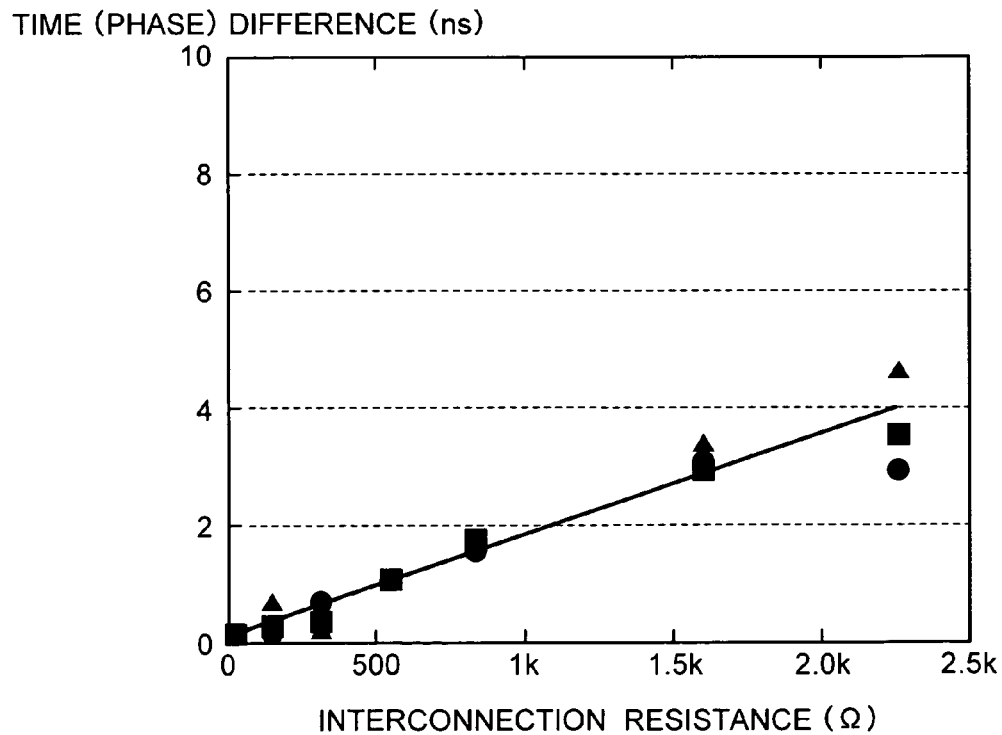
FIG. 20 is a table of the results of measurements of the dependency of interconnection resistance on the phase difference between the voltage amplitude waveform obtained between the AC power source of the AC circuit of FIG. 9 and the resistor-capacitor (R-C) element and the voltage amplitude waveform obtained from the R-C element, for one good product and four defective products.
FIG. 21 is a graph of an example of the dependency of interconnection resistance on the phase difference between the voltage amplitude waveform obtained between the AC power source of the AC circuit of FIG. 9 and the resistor-capacitor (R-C) element and the voltage amplitude waveform obtained from the R-C element.

A table in FIG. 20 shows the results of measuring the dependency of the phase difference between the voltage amplitude waveforms PF1 and PF2 on the interconnection resistance for a good product in which the resistance of the interconnection WR is 10 Ω and four defective products in which the resistance of the interconnection WR is within the range of 500 Ω to 2,000 Ω.

For the example of the good product (resistance R=10 Ω) shown in FIG. 18, the shift magnitude ΔX along the horizontal axis when the voltage amplitude waveform PF1 and the voltage amplitude waveform PF2 matched best was two pixels (average value). For the examples of the defective products shown in FIG. 19, ΔX was 11 pixels (average value) when the resistance R was 500 Ω, ΔX was 17 pixels (average value) when the resistance R was 800 Ω, ΔX was 32 pixels (average value) when the resistance R was 1.6 kΩ, and ΔX was 38 pixels (average value) when the resistance R was 2.2 kΩ.

In this case, since the sine-wave alternating current AC of 2 V and 20 MHz is applied to the rear surface of the surface of the specimen S by this embodiment, one cycle of the voltage amplitude waveform PF1 is 20 MHz. Since the horizontal axis for each of the voltage amplitude waveforms PF1 and PF2 of FIG. 19 is one cycle (cycle (f)=20 MHz=time (T)=1/f=5E−8 s), one pixel along the horizontal axis for the voltage amplitude waveforms PF1 and PF2 represents 100 psec. The equation for calculating the difference between the phases (times) of the voltage amplitude waveform PF1 and the voltage amplitude waveform PF2 is therefore:

phase (time) difference Θ=ΔX(number of pixels for shift magnitude when the sum of squares is a minimum)×100 psec     (Equation 2)

Returning to FIG. 17, the system calculates the phase difference for each semiconductor substrate S being inspected, from Equation 2 for calculating the phase difference (time) Θ (step S12). As a result, a phase (time) difference of 0.2 ns between the voltage amplitude waveform PF1 and the voltage amplitude waveform PF2 is obtained by this embodiment for a good product (resistance 10 Ω or less). Similarly, a phase (time) difference of 1.1 ns between the voltage amplitude waveform PF1 and the voltage amplitude waveform PF2 was obtained for a defective product (resistance 500 Ω), a phase (time) difference of 1.7 ns between the voltage amplitude waveform PF1 and the voltage amplitude waveform PF2 was obtained for a defective product (resistance 800 Ω), a phase (time) difference of 3.2 ns between the voltage amplitude waveform PF1 and the voltage amplitude waveform PF2 was obtained for a defective product (resistance 1.6 kΩ), and phase (time) difference of 3.8 ns between the voltage amplitude waveform PF1 and the voltage amplitude waveform PF2 was obtained for a defective product (resistance 2.2 kΩ). If the phase (time) difference between the voltage amplitude waveform PF1 and the voltage amplitude waveform PF2 is a value such as 1.0 ns or less, therefore, the semiconductor substrate S being inspected can be determined to be a good product, whereas if the phase difference between the voltage amplitude waveform PF1 and the voltage amplitude waveform PF2 is a value such as 1.1 ns or more, the semiconductor substrate S being inspected can be determined to be a defective product. In other words, such a method enables simple inspection for defects by making it possible to determine that a product is good if the phase (time) difference between the voltage amplitude waveform PF1 and the voltage amplitude waveform PF2 is small but defective if the phase difference is large.

In addition, the relationship between the phase difference between the voltage amplitude waveform PF1 and the voltage amplitude waveform PF2 and the interconnection resistance can be obtained previously in graphical form with this embodiment, as a phase difference and interconnection resistance data table. It is therefore possible to obtain the interconnection resistance of the surface of the semiconductor substrate S finally by using this graph of interconnection resistance with respect to phase difference (step S13). This makes it possible to implement a highly accurate inspection in accordance with the specifications required of the final product, by obtaining the interconnection resistance of the semiconductor substrate S being inspected in this manner.

Second Embodiment

Figure 22:
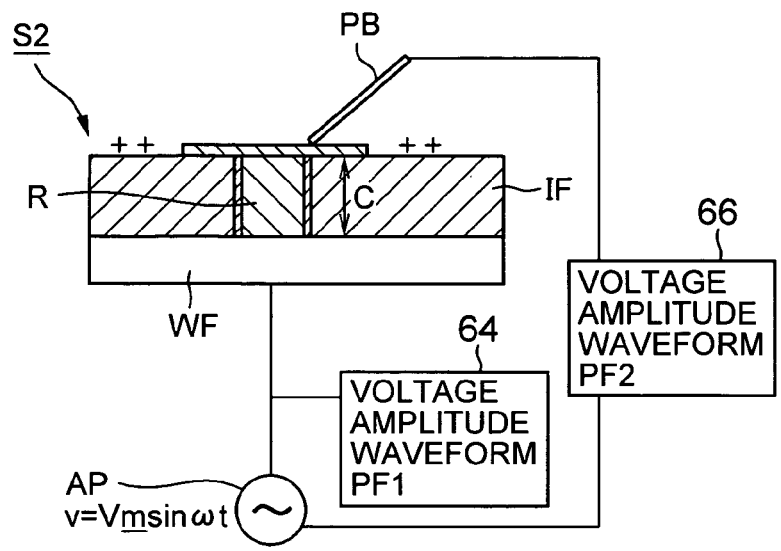
FIG. 22 is a block diagram of a second embodiment of the substrate inspection apparatus according to the present invention.
Figure 23:
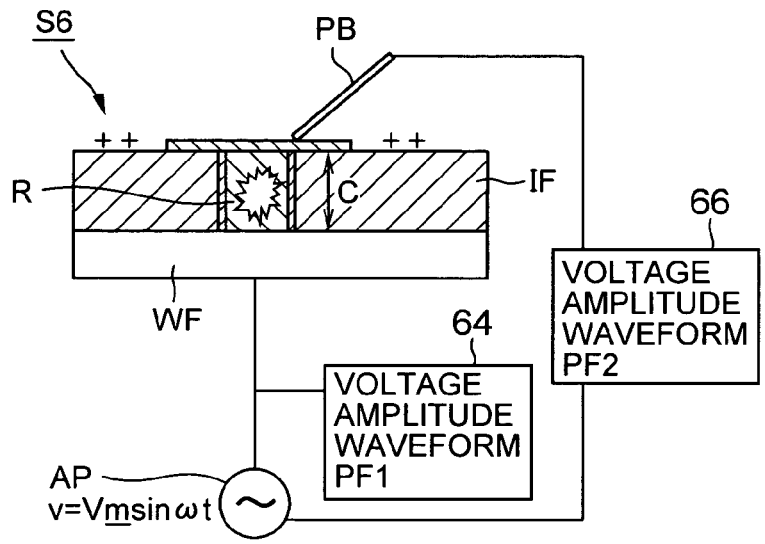
FIG. 23 is a block diagram illustrating the second embodiment of the substrate inspection apparatus according to of the present invention.
Figure 24:
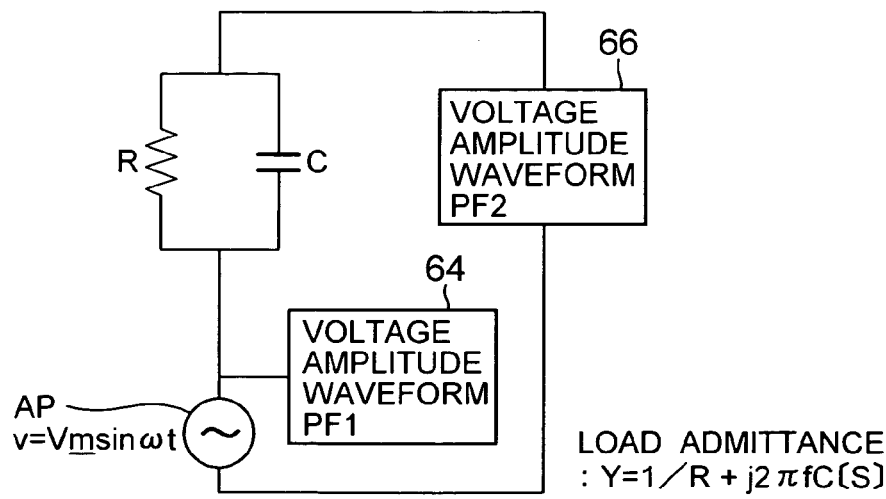
FIG. 24 is an equivalent circuit of the substrate inspection apparatus shown in the block diagrams of FIGS. 22 and 23.

The description now turns to a second embodiment of the present invention, with reference to FIGS. 22 to 24.

FIGS. 22 and 23 are block diagrams of essential portions of a semiconductor substrate inspection apparatus of this embodiment, where FIG. 22 shows a state in which the semiconductor substrate S2 that is a good product (see FIG. 1) is mounted thereon and FIG. 23 shows a state in which the semiconductor substrate S6 that is a defective product in which the interconnection is not completely broken (see FIG. 3) is mounted thereon.

A substrate inspection apparatus 3 of this embodiment comprises the AC power source AP, two oscilloscopes 64 and 66 and a probe pin PB. In a similar manner to the above-described first embodiment, the sine-wave alternating current is applied from the AC power source AP to the P-type silicon wafer WF of the semiconductor substrate S being inspected, the oscilloscope 64 is connected between the AC power source AP and the P-type silicon wafer WF, and the voltage amplitude waveform PF1 of this sine-wave alternating current is acquired thereby. The interconnection WR2 of the semiconductor substrate S2 is connected to the AC power source AP through the oscilloscope 66 by the probe pin PB on the surface WR2s thereof, to form an AC circuit as shown in the equivalent circuit of FIG. 24.

In the method of using the substrate inspection apparatus 3 of this embodiment to inspect the semiconductor substrate S, the voltage amplitude waveform PF2 of the interconnection surface is acquired by the oscilloscope 66 while the sine-wave alternating current is applied to the P-type silicon wafer WF of the semiconductor substrate S, the phase difference from the voltage amplitude waveform PF1 acquired by the oscilloscope 64 is calculated, and the substrate being inspected is determined to be a good product if the thus-calculated phase difference Θ is equal to or below a predetermined threshold or a defective product if the thus-calculated phase difference Θ exceeds the predetermined threshold, in a similar manner to that of the above-described first embodiment. The interconnection resistance of the semiconductor substrate S being inspected can be calculated by using the graph of interconnection resistance with respect to phase difference Θ (see FIG. 21). This makes it possible to determine the degree of defectiveness in accordance with the specifications required of the final product.

Since this embodiment therefore uses just oscilloscopes and a probe to apply the above-described inspection concept in the inspection of semiconductor substrates, it makes it possible to implement substrate inspections with a simple configuration and a high degree of accuracy.

(3) Method of Manufacturing Semiconductor Device

It is possible to manufacture semiconductor devices with high levels of throughput and yield by manufacturing the semiconductor devices by a process that includes a highly accurate inspection step using the above-described substrate inspection method.

The present invention has been described above by way of embodiments thereof, but the present invention is not limited thereto and thus it should be obvious to those skilled in the art that variation modifications thereto are possible within the scope thereof. For example, a sine-wave alternating current is applied to the silicon wafer of the semiconductor substrate in the above-described embodiments, but the waveform is not limited thereto and thus could be triangular, by way of example.

In addition, in the above-described embodiments, the program into which is written the inspection recipe including sequence of steps of a substrate inspection method according to the present invention is stored in a memory. The program is not limited thereto, and thus could also be stored in a hard disk drive unit for reading into a computer. The recording medium is not limited to that of a fixed type but it could also be a portable device such as a flexible disk, a CD-ROM, a magnetic disk or an optical disk. Moreover, the program containing the sequence of steps of the substrate inspection method could also be distributed over a communications network such as the Internet (including wireless networks). Furthermore, the program containing the sequence of steps of the substrate inspection method could be encrypted, modulated, and compressed for distribution over a wired or wireless network such as the Internet, or stored on a recording medium for distribution.

What is claimed is:

1. A substrate inspection apparatus comprising:

a first waveform measurer which acquires a first amplitude waveform that is the amplitude waveform of an AC voltage obtained from a semiconductor of a semiconductor substrate which is being inspected when an external AC power source is connected to said semiconductor and an AC voltage from said AC power source is applied to said semiconductor, the semiconductor substrate also having an interconnection that is supposed to be connected to said semiconductor;

a second waveform measurer which is connectable to said interconnection of the semiconductor substrate and acquires a second amplitude waveform that is the amplitude waveform of a voltage in said interconnection when said AC voltage is applied to said semiconductor; and an evaluator which calculates a phase difference between said first amplitude waveform and said second amplitude waveform, outputs a resistance of the interconnection of the semiconductor substrate with the use of previously prepared data that expresses the relationship between said phase difference and the resistance of interconnection and extracts information on a defect of the semiconductor substrate by comparing the resistance of the interconnection with a threshold value.

2. The substrate inspection apparatus according to claim 1, wherein said evaluator calculates said phase difference by creating two curves of said first and said second amplitude waveforms expressed within a two-dimensional space configured by a time axis and an amplitude axis.

3. The substrate inspection apparatus according to claim 1, wherein at least one of said first and said second waveform measurers comprises an electron microscope having a strobe waveform mode.

4. The substrate inspection apparatus according to claim 1, wherein said first waveform measurer is a first oscilloscope connectable to said semiconductor of the semiconductor substrate and said AC power source and said second waveform measurer is a second oscilloscope having one end connectable to said AC power source and the other end thereof connectable to said interconnection of the semiconductor substrate via a probe.

5. The substrate inspection apparatus according to claim 1, wherein the waveform of said AC voltage is a sine-wave current or a triangular-wave current.

6. A substrate inspection apparatus, comprising a first waveform measurer which acquires a first amplitude waveform that is the amplitude waveform of an AC voltage obtained from a semiconductor of a semiconductor substrate which is being inspected when an external AC power source is connected to said semiconductor and an AC voltage from said AC power source is applied to said semiconductor, the semiconductor substrate also having an interconnection that is supposed to be connected to said semiconductor;

a second waveform measurer which is connectable to said interconnection of the semiconductor substrate and acquires a second amplitude waveform that is the amplitude waveform of a voltage in said interconnection when said AC voltage is applied to said semiconductor; and an evaluator which calculates a phase difference between said first amplitude waveform and said second amplitude waveform by creating two curves of said first and said second amplitude waveforms expressed within a two-dimensional space configured by a time axis and an amplitude axis, extracts information on a defect of the semiconductor substrate on the basis of the thus-calculated phase difference by calculating the magnitude of shift in a direction of said time axis which would provide the best matching of said two curves and the smallest sum of squares of said two curves, and uses previously prepared data that expresses the relationship between said phase difference and the resistance of interconnection to output the resistance of the interconnection of the semiconductor substrate.

7. A substrate inspection method comprising:
acquiring a first amplitude waveform that is the amplitude waveform of an AC voltage obtained from a semiconductor of a semiconductor substrate which is being inspected when an AC power source is connected to said semiconductor and an AC voltage from said AC power source is applied to said semiconductor, the semiconductor substrate also having an interconnection that is supposed to be connected to said semiconductor;
acquiring a second amplitude waveform that is the amplitude waveform of a voltage in said interconnection when said AC voltage is applied to said semiconductor; and
calculating the phase difference between said first amplitude waveform and said second amplitude waveform, outputting a resistance of the interconnection of the semiconductor substrate with the use of previously prepared data that expresses the relationship between said phase difference and the resistance of said interconnection and extracting information on a defect of the semiconductor substrate by comparing the resistance of the interconnection with a threshold value.

8. The substrate inspection method according to claim 7, wherein said calculating the phase difference includes creating two curves of said first and said second amplitude waveforms expressed within a two-dimensional space configured by a time axis and an amplitude axis.

9. The substrate inspection method according to claim 7, wherein the waveform of said AC voltage is a sine-wave current or a triangular-wave current.

10. A substrate inspection method comprising:
acquiring a first amplitude waveform that is the amplitude waveform of an AC voltage obtained from a semiconductor of a semiconductor substrate which is being inspected when an AC power source is connected to said semiconductor and an AC voltage from said AC power source is applied to said semiconductor, the semiconductor substrate also having an interconnection that is supposed to be connected to said semiconductor;
acquiring a second amplitude waveform that is the amplitude waveform of a voltage in said interconnection when said AC voltage is applied to said semiconductor;
calculating the chase difference between said first amplitude waveform and said second amplitude waveform by creating two curves of said first and said second amplitude waveforms expressed within a two-dimensional space configured by a time axis and an amplitude axis;
extracting information on a defect of the semiconductor substrate on the basis of the thus-calculated phase difference by calculating the magnitude of shift in a direction of said time axis which would provide the best matching of said two curves and the smallest sum of squares of said two curves to extract said phase difference, and using a previously prepared data that expresses the relationship between said phase difference and the resistance of interconnection to output the resistance of the interconnection of the semiconductor substrate.

11. A recording medium to store a program which causes a computer to execute a method of inspecting a semiconductor substrate to be inspected that has a semiconductor and an interconnection that is supposed to be connected to said semiconductor, said computer being capable of inputting data on a first amplitude waveform and a second amplitude waveform of AC voltages, said first amplitude waveform being obtained when an AC power source is connected to said semiconductor of the semiconductor substrate and an AC voltage from said AC power source is applied to said semiconductor, and said second amplitude waveform being obtained in said interconnection when the AC voltage from said AC power source is applied to said semiconductor, said substrate inspection method comprising:
calculating the phase difference between said first amplitude waveform and said second amplitude waveform, outputting a resistance of the interconnection of the semiconductor substrate with the use of previously prepared data that expresses a relationship between said phase difference and the resistance of interconnection and extracting information on a defect of the semiconductor substrate by comparing the resistance of the interconnection with a threshold value.

12. The recording medium according to claim 11, wherein said information on a defect of the semiconductor substrate is extracted with the use of a phase difference between said first amplitude waveform and said second amplitude waveform that have been calculated for a good product, as a threshold.

13. The recording medium according to claim 11, wherein said extracting information on a defect of the semiconductor substrate includes calculating said phase difference by creating two curves of said first and said second amplitude waveforms expressed within a two-dimensional space configured by a time axis and an amplitude axis.

14. A recording medium to store a program which causes a computer to execute a method of inspecting a semiconductor substrate to be inspected that has a semiconductor and an interconnection that is supposed to be connected to said semiconductor, said computer being capable of inputting data on a first amplitude waveform and a second amplitude waveforms of AC voltages, said first amplitude waveform being obtained when an AC power source is connected to said semiconductor of the semiconductor substrate and an AC voltage from said AC power source is applied to said semiconductor, and said second amplitude waveform being obtained in said interconnection when the AC voltage from said AC power source is applied to said semiconductor, said substrate inspection method comprising:
calculating the phase difference between said first amplitude waveform and said second amplitude waveform by creating two curves of said first and said second amplitude waveforms expressed within a two-dimensional space configured by a time axis and an amplitude axis;
extracting information on a defect of the semiconductor substrate on the basis of the thus-calculated phase difference by calculating the magnitude of shift in a direction of said time axis which would provide the best matching of said two curves and the smallest sum of squares of said two curves to extract said phase difference, and using a previously prepared data that expresses the relationship between said phase difference and the resistance of interconnection to output the resistance of the interconnection of the semiconductor substrate.

15. A method of manufacturing a semiconductor device, comprising:
acquiring a first amplitude waveform that is the amplitude waveform of an AC voltage obtained from a semiconductor of a semiconductor substrate which is being inspected when an AC power source is connected to said semiconductor and an AC voltage from said AC power source is applied to said semiconductor, the semiconductor substrate also having an interconnection that is supposed to be connected to said semiconductor;

acquiring a second amplitude waveform that is the amplitude waveform of a voltage in said interconnection when said AC voltage is applied to said semiconductor; and calculating the phase difference between said first amplitude waveform and said second amplitude waveform, outputting the resistance of the interconnection of the semiconductor substrate with the use of previously prepared data that expresses the relationship between said phase difference and the resistance of interconnection; and extracting information on a defect of the semiconductor substrate by comparing the resistance of the interconnection with a threshold value.

16. The method of manufacturing a semiconductor device according to claim 15, wherein calculating the phase difference includes creating two curves of said first and said second amplitude waveforms expressed within a two-dimensional space configured by a time axis and an amplitude axis.

17. A method of manufacturing a semiconductor device, comprising acquiring a first amplitude waveform that is the amplitude waveform of an AC voltage obtained from a semiconductor of a semiconductor substrate which is being inspected when an AC power source is connected to said semiconductor and an AC voltage from said AC power source is applied to said semiconductor, the semiconductor substrate also having an interconnection that is supposed to be connected to said semiconductor;

acquiring a second amplitude waveform that is the amplitude waveform of a voltage in said interconnection when said AC voltage is applied to said semiconductor;

calculating the Phase difference between said first amplitude waveform and said second amplitude waveform by creating two curves of said first and said second amplitude waveforms expressed within a two-dimensional space configured by a time axis and an amplitude axis; and extracting information on a defect of the semiconductor substrate on the basis of the thus-calculated phase difference by calculating the magnitude of shift in a direction of said time axis which would provide the best matching of said two curves and the smallest sum of squares of said two curves to extract said information on phase difference, and using a previously prepared data that expresses the relationship between said phase difference and the resistance of interconnection to output the resistance of the interconnection of the semiconductor substrate.

* * * * *